US012131765B2

United States Patent
Visconti

(10) Patent No.: US 12,131,765 B2
(45) Date of Patent: Oct. 29, 2024

(54) WORD LINE PRECHARGING SYSTEMS AND METHODS

(71) Applicant: Micron Technology, Inc., Boise, ID (US)

(72) Inventor: Angelo Visconti, Gentile (IT)

(73) Assignee: Micron Technology, Inc., Boise, ID (US)

( * ) Notice: Subject to any disclaimer, the term of this patent is extended or adjusted under 35 U.S.C. 154(b) by 217 days.

(21) Appl. No.: 17/898,923

(22) Filed: Aug. 30, 2022

(65) Prior Publication Data

US 2024/0071454 A1  Feb. 29, 2024

(51) Int. Cl.
*G11C 11/22* (2006.01)

(52) U.S. Cl.
CPC ................. *G11C 11/2257* (2013.01)

(58) Field of Classification Search
CPC ... G11C 11/2257; G11C 11/22; G11C 11/221; G11C 11/223; G11C 11/2277
See application file for complete search history.

(56) References Cited

U.S. PATENT DOCUMENTS

| 10,446,214 | B1 | 10/2019 | Di Vincenzo et al. |
| 10,607,676 | B2 | 3/2020 | Di Vincenzo |
| 10,896,712 | B2 | 1/2021 | Visconti et al. |
| 10,964,372 | B2 | 3/2021 | Visconti et al. |
| 10,984,847 | B2 | 4/2021 | Visconti |
| 11,074,956 | B1 | 7/2021 | Vo et al. |
| 11,127,449 | B2 | 9/2021 | Vo et al. |
| 2003/0058702 | A1* | 3/2003 | Demange ............... G11C 11/22 365/200 |
| 2007/0047300 | A1* | 3/2007 | Lee ..................... G11C 11/5642 365/185.03 |
| 2008/0158934 | A1* | 7/2008 | Kang ..................... G11C 11/22 365/145 |
| 2016/0247573 | A1* | 8/2016 | Maejima ............... G11C 16/32 |
| 2019/0096479 | A1* | 3/2019 | Yu ........................ G11C 16/26 |
| 2021/0304812 | A1 | 9/2021 | Locatelli et al. |

* cited by examiner

*Primary Examiner* — Han Yang
(74) *Attorney, Agent, or Firm* — Fletcher Yoder, P.C.

(57) ABSTRACT

Systems and methods described herein may enable a memory system to selectively provide a signal boost to a word line to precharge the word line. A memory device may include voltage shaping circuitry and a memory controller. The memory controller may cause the voltage shaping circuitry to adjust a characteristic of a word line select control signal transmitted via the word line prior to the word line select control signal being transmitted to a memory cell.

18 Claims, 5 Drawing Sheets

WORD LINE PRECHARGING SYSTEMS AND METHODS

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to memory devices. The techniques and methods described herein may be used with ferroelectric memory devices or other types of memory devices that are to be periodically refreshed. Memory devices are widely used to store information in various electronic devices such as computers, wireless communication devices, cameras, digital displays, and the like. Information is stored by programming different states of a memory device. For example, binary memory devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. Some of the memory devices include memory cells that may be accessed by turning on a transistor that couples the memory cell (e.g., the capacitor) with a word line or a digit line. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous in applications.

FeRAM may use similar device architectures as a volatile memory but may have non-volatile properties due to the use of a ferroelectric capacitor as a storage device. FeRAM devices may thus have improved performance compared to some other non-volatile and volatile memory devices.

Keeping the foregoing in mind, a FeRAM cell may be accessed as part of a memory operation. To do so, one or more signals are transmitted to the FeRAM cell. Changes in memory cell structure may contribute to slowed access times relative to traditional DRAM memory access times. Furthermore, changes in the memory cell structure to provide the FeRAM cell may cause a selected word line (WL) to inject a disturbance through a coupling effect on relatively proximate unselected word lines, which may undesirably impact memory device performance by increasing a likelihood of incorrect memory reads.

BRIEF DESCRIPTION OF THE DRAWINGS

Various aspects of this disclosure may be better understood upon reading the following detailed description and upon reference to the drawings in which.

DETAILED DESCRIPTION

Figure 1:
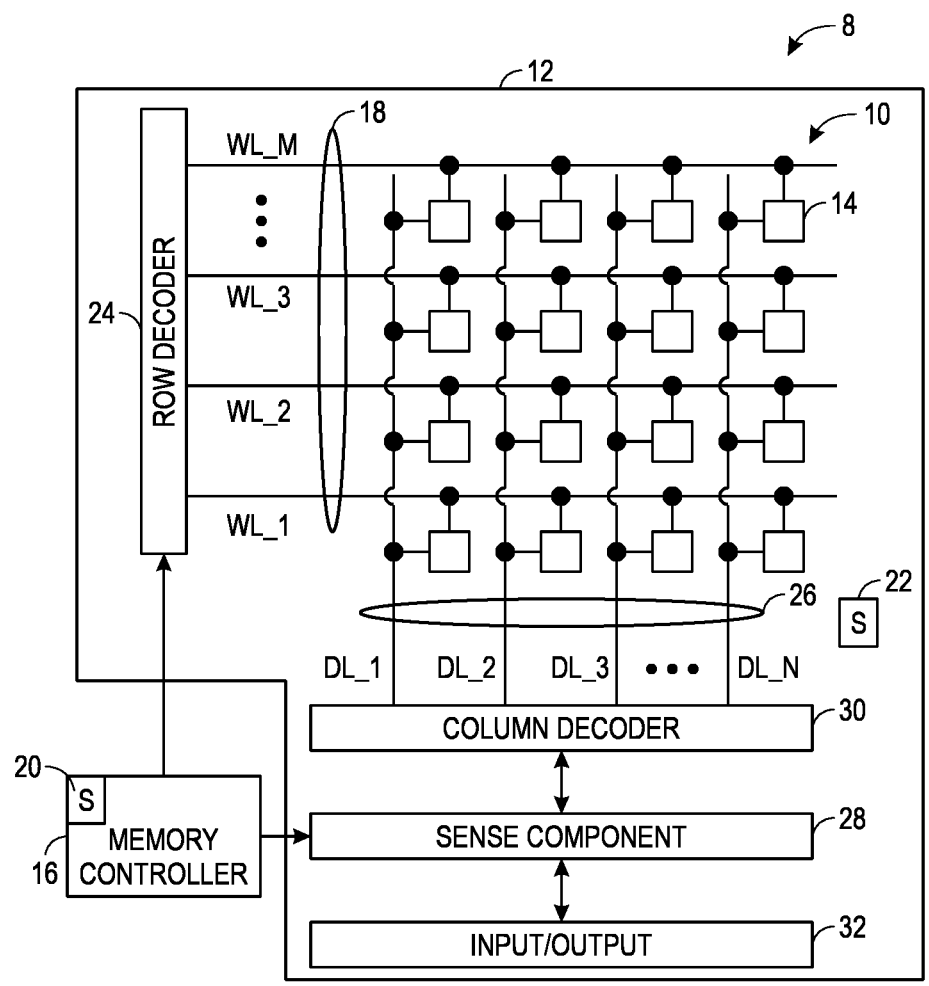
FIG. 1 illustrates an example of a memory array, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Different memories may use different memory architectures to store and retrieve data bits using different memory states. In some embodiments, each memory state may refer to a distinct distribution of charges on a memory cell. For example, each memory cell of a ferroelectric random access memory (FeRAM) may include a ferroelectric capacitor including ferroelectric material. The ferroelectric capacitor may store memory states using charge dipoles of the memory cell (e.g., positive and negative charge distributions). A state of such memory cells may be written to or read from by applying a voltage. In specific embodiments, the applied voltage may flip the memory cell dipole. Such memory cells may use a reference voltage, as a threshold, to distinctively identify whether a positive or negative charge distribution (e.g., dipole) is being written or sensed. In some embodiments, an intermediary memory state (e.g., third memory state) may be programmed and sensed using an intermediary charge distribution between the positive and negative charge distributions. Indeed, some memory cells may include two reference voltages and may store and sense three distinct memory states.

Keeping the foregoing in mind, an FeRAM device may include one or more memory cells that may be periodically accessed to read or write data. However, the FeRAM device access speeds may be slower when compared to speeds of DRAM devices. When left unmitigated, the FeRAM may suffer data loss due to operations of an electronic device expecting and/or being timed for the faster DRAM memory access speeds. That is, a memory controller may expect one switching speed and complete an access operation before an accurate data value is output from the one or more memory cells (since access speeds may slow in lower temperatures), thereby causing propagation of incorrect data as a result of the access operation. Furthermore, disturbances may be introduced from word line signal changes during a FeRAM memory access operation that, if left unmitigated, may cause undesired power consumption or data corruption.

To remedy this, switchable row driver systems and methods are described herein. A memory controller of a memory device may temporarily boost (e.g., precharge) a word line signal at the beginning of a memory access operation to a voltage level less than an "on" state voltage level of the word line signal. To do so, the memory device may include row drivers coupled to word lines of the memory cells. A respective row driver may be provided a variable high voltage supply over the duration of an access operation. Changing the high voltage supply of the row driver may change a voltage value of the word line. The row driver may be configurable to precharge the word line before the word line is to be used during an activation phase of the access operation. Indeed, the row driver may provide a booster voltage signal to the memory cell during a portion of an access operation (e.g., during an initial read operation). The word line precharge may occur while (e.g., in parallel to) an associated digit line is precharged.

By precharging the word line, the FeRAM device may experience faster cell access speeds, and thus an improved cell read window due to faster access speeds, enabling a shorter duration being used to access the memory cell. Furthermore, increasing an amount of time used to increase a voltage of the word line to an operational voltage level (e.g., high supply voltage (Vccp)) by precharging the word line may reduce a magnitude of disturbances that may be introduced when transmitting signals via the word line during the access operation. Furthermore, increasing an amount of operational time available to use to charge the word line by performing the operation in parallel with precharging the digit line may further improve memory operation by enabling less time to be spent charging the word line to the correct voltage level during the activation phase of the access operation. Using a shorter amount of time to access the memory cell may be desired due to a buffer in timing it can add to subsequent operation timing.

Referring now to FIG. 1, a memory system 8 is illustrated in accordance with various examples of the present disclosure. The memory system 8 includes a memory array 10 that has a number of memory cells, including a memory cell 14, that are programmable to store different states, such as two, three, or more memory states. The memory cell 14 may be programmable with data having a voltage value that corresponds to a logical high binary data or to a logical low binary data.

A memory controller 16 may communicate with the memory device 12 to perform read operations, write operations, and refresh operations. The memory controller 16 may include a tangible, non-transitory computer readable medium programmed with instructions that, when executed by a processor, cause the memory controller 16 to perform operations described herein.

The memory cell 14 may include a capacitor that has a ferroelectric as the dielectric material to store a charge representative of the programmable states. For example, the capacitor may represent three memory states using three distinct charge levels.

Memory operations, such as reading and writing memory states, may be performed on the memory cell 14 by activating or selecting the appropriate word line 18 and digit line 26. Activating or selecting a word line 18 or a digit line 26 may include applying a voltage to the respective lines. Word lines 18 and digit lines 26 are made of conductive materials. For example, word lines 18 and digit lines 26 may be made of metals (such as copper, aluminum, gold, tungsten, etc.), metal alloys, other conductive materials, or the like. According to the example of FIG. 1, each row of the memory cells 14 is connected to a single word line 18, and each column of the memory cells 14 is connected to a single digit line 26.

By applying a voltage to the word line 18 and the digit line 26, a single memory cell 14 may be activated (or accessed) at their intersection. Accessing such memory cell 14 may include performing reading or writing operation on the memory cell 14. The intersection of a word line 18 and digit line 26 may be referred to as an address of a respective memory cell 14.

In some architectures, the memory state storage of the memory cell 14 (e.g., the capacitor) may be electrically isolated from the digit line by a selection component. The word line 18 may be connected to and may control the selection component. For example, the selection component may be a transistor and the word line 18 may be connected to the gate of the transistor. Activating the word line 18 results in an electrical connection or closed circuit between the capacitor of a memory cell 14 and its corresponding digit line 26. The digit line 26 may then be accessed to either read or write the memory cell 14. In some examples, the word line 18 may be activated multiple times to facilitate sensing. In some cases, the word line 18 may be activated a first time to facilitate sensing of a first charge of a first type (e.g., dielectric charge) and a second time to facilitate sensing of a second charge of a second type (e.g., polarization charge). In some cases, the first time and the second time may be discontinuous or separated in time.

Accessing the memory cell 14 may be controlled through a respective row decoder 24 and a respective column decoder 30. In some examples, a row decoder 24 receives a row address from the memory controller 16 and activates the appropriate word line 18 based on the received row address. Similarly, a column decoder 30 receives a column address from the memory controller 16 and activates the appropriate digit line 26. For example, memory array 10 may include multiple word lines 18, labeled WL_1 through WL_M, and multiple digit lines 26, labeled DL_1 through DL_N, where M and N depend on the array size. Thus, by activating a word line 18 and a digit line 26 (e.g., WL_2 and DL_3), the memory cell 14 at their intersection may be accessed.

Upon accessing, the memory cell 14 may be read, or sensed, by sense component 28 to determine the stored state of the memory cell 14. A capacitor of a targeted memory cell 14 may be discharged to induce a change in voltage of a corresponding digit line 26 to the targeted memory cell 14. The column decoder 30 may receive signals transmitted via the digit line 26 and may transmit the signals onto the sense component 28 for further processing. The sense component 28 may compare the signals to a reference voltage to determine the stored state of the targeted memory cell 14, where a voltage greater than a first reference voltage may indicate a logical high state and a voltage less than a second reference voltage may indicate a logical low state. In some cases, a single reference voltage may be used to differentiate between a logical high state and a logical low state, where a voltage greater than the single reference voltage indicates a logical high state and a voltage less than or equal to the single reference voltage indicates a logical low state. Additional reference voltages may be used based on a number of states capable of being stored in the targeted memory cell 14. The sense component 28 may include various transistors or amplifiers in order to detect and amplify a difference in the signals. The memory cell 14 may be set, or written, by activating the relevant word line 18 and digit line 26. As discussed above, activating a word line 18 electrically connects the corresponding row of memory cells 14 to their respective digit lines 26. By controlling the relevant digit line 26 while the word line 18 is activated, the memory cell 14 may be written—i.e., a memory state may be stored in the memory cell 14. The column decoder 30 may accept data, for example at input 32, to be written to the memory cells 14. The memory cell 14 may be written by applying a voltage across the ferroelectric capacitor of the memory cell 14. This process is discussed in more detail below.

In some cases, the memory cell 14 may be written after a read operation to write back data that has been read from the cell (or, alternatively, from other cells in some cases) or to refresh data. In some cases, a write operation may include writing a first charge (e.g., a first polarization charge) and a second charge (e.g., a dielectric compensation charge) to the memory cell 14. In some cases, writing one charge to the memory cell 14 may be based on a voltage of a cell plate relative to a voltage of one or more other components (e.g., a sense amplifier). In some cases, writing a first charge (e.g., a polarization charge) to a memory cell 14 may occur before, during an overlapping interval, or at the same time as writing the second charge (e.g., a dielectric compensation charge) to the memory cell 14. In some cases, a write operation may be based on setting a polarization state, a dielectric state, or both, or by flipping one or more digits using cell or component selection.

In some memory architectures, accessing the memory cell 14 may degrade or destroy the stored logic state and re-write or refresh operations may be performed to return the original logic state to the memory cell 14. In DRAM, for example, the capacitor may be partially or completely discharged during a sense operation, corrupting the stored logic state. As such, the logic state may be re-written after a sense operation. Additionally, activating a single word line 18 may result in the discharge of all memory cells 14 in the row; thus, several or all memory cells 14 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, the ferroelectric memory cells (e.g., memory cells 14) may have beneficial properties that may result in improved performance relative to other memory architectures.

The memory controller 16 may control the operation (e.g., read, write, re-write, refresh, etc.) of the memory cells 14 through the various components, such as the row decoder 24, the column decoder 30, and the sense component 28. The memory controller 16 may generate row and column address signals in order to activate the desired word line 18 and digit line 26. The memory controller 16 may also provide and control various voltage levels used during the access operations of the memory device 12. In general, the amplitude, shape, or duration of an applied voltage discussed herein may be adjusted or varied and may be different for the various operations for operating the memory system 8. Furthermore, one, multiple, or all memory cells 14 within the memory system 8 may be accessed simultaneously; for example, multiple or all cells of the memory system 8 may be accessed simultaneously during a reset operation in which all memory cells 14, or a group of memory cells 14, are set to a single logic state.

In some embodiments, refresh operations may be based on sensed data generated by sensors associated with memory. The memory controller 16 may be communicatively coupled to a first sensor 20 and the memory device 12 may include a second sensor 22 on a same chip as the memory device 12. The first sensor 20 may be thermally coupled to the memory controller 16 and the second sensor 22 may be thermally coupled to the memory device 12. Any manufacturing method may be used to form the first sensor 20, the second sensor 22, the memory device 12, and/or the memory controller 16 in general and/or to attach the component to the respective board, chip, package, or the like, including, for example, chemical vapor deposition (CVD), physical assembly, or the like. In any case, the first sensor 20 and the second sensor 22 may provide a temperature measurement that is indicative of a temperature of the memory device 12. Thus, the memory controller 16 may use an indication of the temperature from the first sensor 20 or from the second sensor 22 with a method to generally obtain the temperature of the memory device 12.

Figure 2:
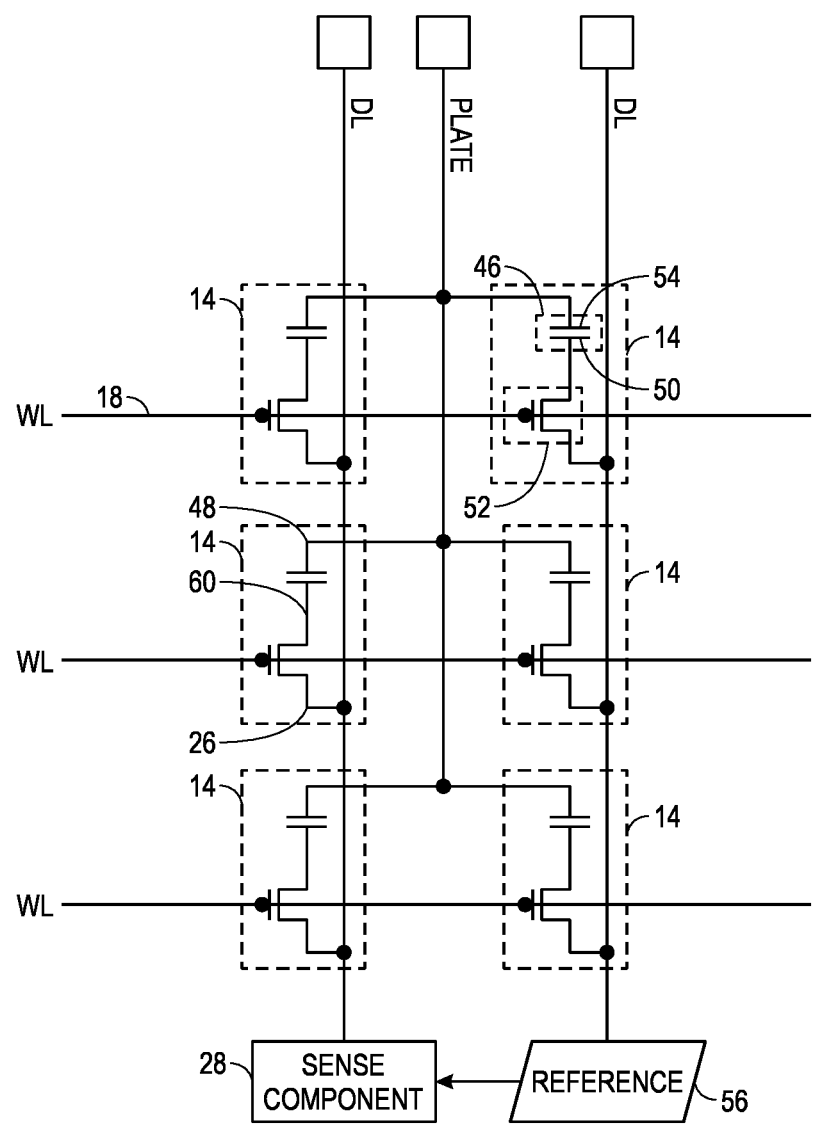
FIG. 2 illustrates an example circuit that includes one or more memory cells of the memory array of FIG. 1, in accordance with an embodiment of the present disclosure.

Keeping the foregoing in mind, FIG. 2 illustrates an example circuit 44 that includes one or more memory cells 14 of the memory array 10 of FIG. 1 in accordance with various examples of the present disclosure. The circuit 44 includes an example ferroelectric memory cell 14, word line 18, digit line 26, and sense component 28, which may be examples of the memory cell 14, word line 18, digit line 26, and sense component 28, respectively, as described with reference to FIG. 1.

The ferroelectric memory cell 14 may include a logic storage component, such as a ferroelectric capacitor 46 that has a first plate, cell plate 54, and a second plate, cell bottom 50. The cell plate 54 and the cell bottom 50 may be capacitively coupled through a ferroelectric material positioned between them. Two cell plates 54 may be coupled together via a plate line 48. The orientation of cell plate 54 and cell bottom 50 may be flipped without changing the operation of the ferroelectric memory cell 14. The circuit 44 may also include a selection component 52 and reference voltages 56. In the example of FIG. 2, the cell plate 54 may be accessed via the plate line 48 and the cell bottom 50 may be accessed via the digit line 26. As described above, various states may be stored by charging or discharging the ferroelectric capacitor 46. The cell bottom 50 may be coupled to a selection component 52 via a cell bottom (CB) line 60.

The stored state of the ferroelectric capacitor 46 may be read or sensed by operating various elements represented in the circuit 44. The ferroelectric capacitor 46 may be in electronic communication with the digit line 2. For example, the ferroelectric capacitor 46 can be isolated from the digit line 26 when the selection component 52 is deactivated, and the ferroelectric capacitor 46 can be connected to the digit line 26 when the selection component 52 is activated. Activating the selection component 52 may be referred to as selecting the ferroelectric memory cell 14. Selecting the memory cell 14 may involve sending a signal via a pair of a word line 18 and a digit line 26. One word line 18 may be selected at a time when accessing the corresponding memory cell.

In some cases, the selection component 52 is a transistor and its operation is controlled by applying a voltage to the transistor gate terminal, where the voltage magnitude is greater than the threshold magnitude of the transistor. The word line 18 may activate the selection component 52; for example, a voltage applied to the word line 18 is applied to the transistor gate, connecting the ferroelectric capacitor 46 with the digit line 26.

A fixed or constant voltage may be applied to the cell plate 54 using the plate line 48. This operation may be referred to as "fixed cell plate." In order to read the memory state of a ferroelectric memory cell 14, for example, the digit line 26 may be virtually grounded and subsequently isolated from virtual ground prior to applying a voltage to the word line 18. Selecting the ferroelectric memory cell 14 may result in a voltage difference across the ferroelectric capacitor 46, since the plate line 48 is held at a finite voltage and the digit line 26 is virtually grounded. The voltage difference may be the induced voltage or sensed voltage discussed above. Moreover, the voltage difference value may refer to one of multiple sensing voltages, corresponding to one of multiple distinct charge distributions in the ferroelectric memory cell 14, and indicative of the multiple memory states. As a result, the voltage of the digit line 26 may change (e.g., become some finite value). In some embodiments, this induced voltage may be compared at the sense component 28 with a first reference voltage and a second reference voltage of the reference voltages 56 to determine a memory state.

To write to the memory cell 14, a voltage may be applied across the ferroelectric capacitor 46 to induce accumulation of the respective amount of charges. Various methods may be used to induce accumulation of the respective amount of charges. In one example, the selection component 52 may be activated through word line 18 in order to electrically connect the ferroelectric capacitor 46 to the digit line 26. A voltage may be applied across the ferroelectric capacitor 46 by controlling the voltage of the cell plate 54 (through the plate line 48) and the cell bottom 50 (through the digit line 26). The differential voltage between the cell plate 54 and the cell bottom 50 may be driven to the first sensing voltage to write the first memory state. A similar process may be performed to write the second memory state.

Figure 3:
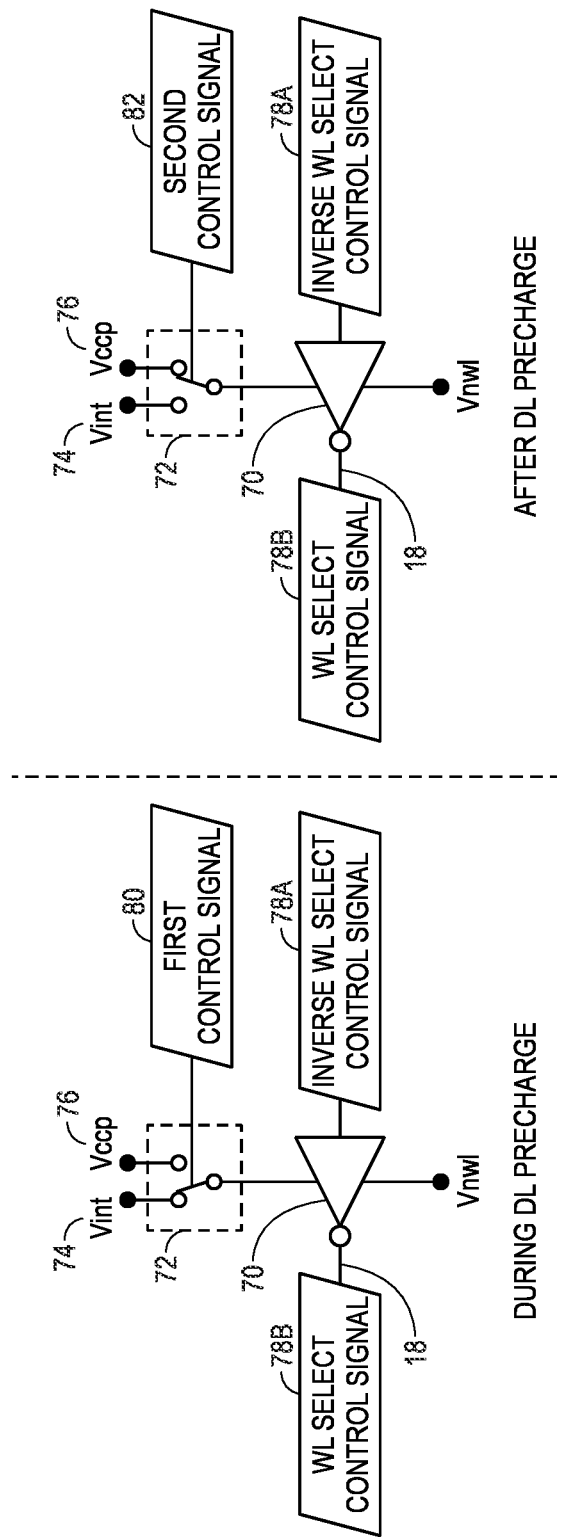
FIG. 3 illustrates an example circuit used to precharge a word line, in accordance with an embodiment of the present disclosure.

Memory access operations may be improved by using word line precharge systems and methods, as described above. To elaborate, FIG. 3 illustrates a block diagram of an example circuit used to precharge a word line in accordance with various examples of the present disclosure. Shown is a row driver 70 at a first time (e.g., during a digit line precharge phase of an access operation) and at a second time (e.g., after the digit line precharge phase). A row driver (not shown) in general may receive a signal at an input, may invert the signal, and may transmit the inverted signal at an output. To do so, the row driver may receive and be coupled to a static high voltage supply and a static low voltage supply (or a ground voltage). This enables the signal received via the row driver to be pulled up or down to the respective supply values when the signal is inverted.

However, in accordance with the presently described embodiments, the row driver 70 may be coupled to a switch 72 that couples to two different supply rails. A first supply rail 74 may supply an initialization voltage (Vint) and a second supply rail 76 may supply a high voltage supply (Vccp). The row driver 70 may also be coupled to a low voltage supply (Vnwl).

To improve memory operations, such as to reduce disturbances associated with word line usage during memory access operations in FeRAM cells 14, the row driver 70 may be operated to precharge the word line 18 during the digit line precharge phase of an access operation and may be operated to charge the word line 18 normally after the digit line precharge phase completes. By stepping a voltage level of the word line 18, and thus shaping a bias of the selected word line 18, a speed at which the word line 18 reaches the activation voltage (Vccp) may increase since an intermediate initialization voltage (Vint) is introduced and applied during an earlier operation. This way, when the digit line 26 has been precharged, the next operations which bring the word line 18 to the activation voltage (Vccp) start from the initialization voltage (Vint) and thus take less time to get to the final activation voltage (Vccp). Breaking the activation phase into two, sequential operations may leverage transistor off current (Ioff) characteristics and current-voltage (I-V) response of the memory cell 14 since the introduced initialization voltage (Vint), when kept to a suitable voltage value, may be tolerable by the FeRAM cell 14 during the digit line 26 precharge phase time. Indeed, despite the additional voltage step, the selection component 52 may remain off as long as the initialization voltage (Vint) remains less than a threshold voltage of the selection component 52. Thus, the selection component 52, and subsequently the memory cell 14, continues to be accessed during the activation phase once the word line 18 is charged to the activation voltage (Vccp) despite receiving some voltage (e.g., initialization voltage (Vint)) during the precharge phases.

With this in mind, during the digit line 26 precharge phase, the row driver 70 may receive an inverse word line select control signal 78A as an input signal. The row driver 70 may be coupled to the initialization voltage (Vint) via a switch 72. The switch 72 may be operated in a first state in response to a first control signal 80 from a memory controller 16. The first control signal 80 may be a logic high or low signal and a second control signal 82 may have an opposite value to the first control signal 80 (e.g., be a "0" when the first control signal 80 is a "1"). The switch 72 may be operated in the first state for a duration of time corresponding to the digit line precharge phase.

Figure 4:
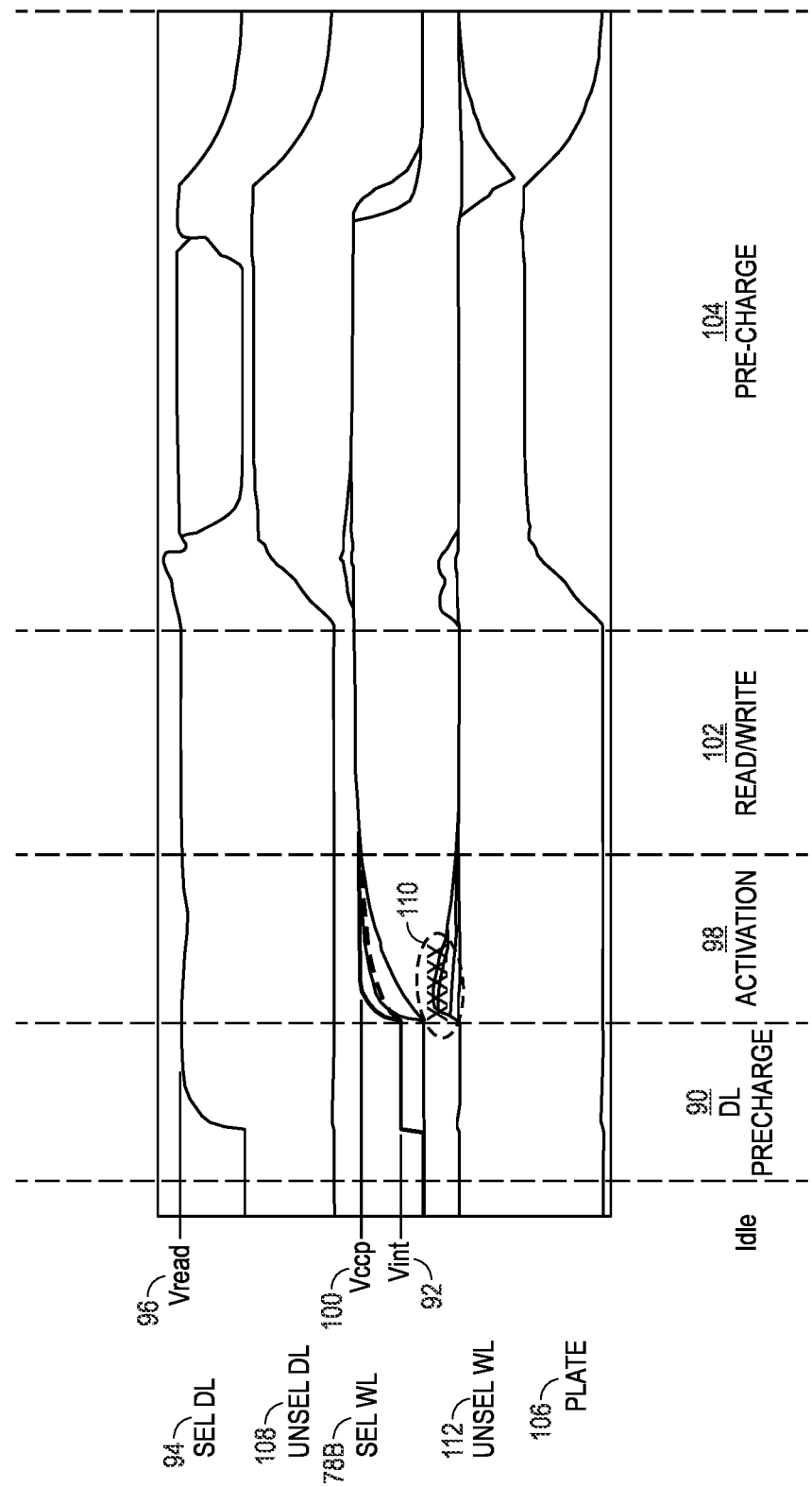
FIG. 4 illustrates a timing diagram corresponding to word line precharging associated with the circuit of FIG. 3, in accordance with an embodiment of the present disclosure.

To visualize the precharge phase, FIG. 4 illustrates a timing diagram corresponding to word line precharging associated with the circuit of FIG. 3 in accordance with various examples of the present disclosure. For ease of explanation, FIG. 4 is explained in parallel with FIG. 3. During a digit line (DL) precharge phase 90, a word line select control signal 78B (SEL WL) (e.g., inverted output from the row driver 70 of FIG. 3) may be charged to an initialization voltage (Vint) level 92 while the row driver 70 is coupled to the initialization voltage (Vint) supply rail via the switch 72. During the DL precharge phase 90, a select digit line signal 94 (SEL DL) and digit line 26 may be charged to a read voltage level (Vread) 96. During the subsequent activation phase 98, the word line select control signal 78B may be charged to an activation voltage (Vccp) level 100 in response to the switch 72 being coupled to an activation voltage (Vccp) supply rail. Thus, at a first time, the memory controller 16 may send a first control signal to the row driver circuitry (e.g., voltage shaping circuitry that include switch 72 and row driver 70 or other suitable circuitry), causing the signal to increase in voltage to a second voltage level (e.g., Vint) from a first voltage level (e.g., a starting voltage, zero). Later, at a second time, the memory controller 16 may send a second control signal to the row driver circuitry (e.g., switch 72 and row driver 70), causing the signal to increase in voltage to a third voltage level (e.g., Vccp) from the second voltage level (e.g., Vint).

During a read/write phase 102, the ferroelectric capacitor 46 is accessed once the selection component 52 turns on in response to the word line select control signal 78B reaching the activation voltage (Vccp). The read/write phase 102 may be followed by a phase used to return voltage levels to a lower voltage level, such as a precharge phase 104 or another memory operation. A plate signal 106 (PLATE) may correspond to a signal transmitted via the plate line 48. The plate signal 106, an unselected digit line signal 108 (UNSEL DL), and the select digit line signal 94 may change in value as the ferroelectric capacitor 46 discharges.

The "X" 110 on an unselected word line signal 112 (UNSEL WL) may illustrate previous interferences that, using precharging methods described herein, may no longer affect unselected word line signals 112 that are adjacent or relatively proximate to a selected word line 18 receiving the WL select control signal 78B. Reducing an impact that a selection operation has on nearby unselected word lines 112 may reduce power consumed by these other memory cell components and may improve memory device operation overall.

Figure 5:
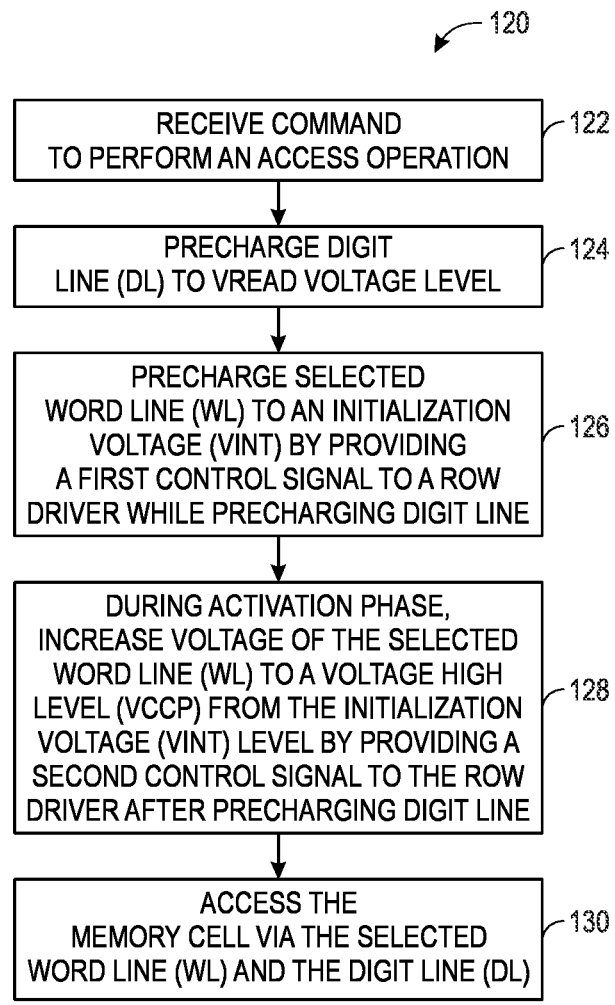
FIG. 5 illustrates a flowchart of a method of performing a memory access operation based on the word line precharging of FIG. 4, in accordance with an embodiment of the present disclosure.

FIG. 5 illustrates a flowchart of a method of performing a memory access operation based on the word line 18 precharging operations in accordance with various examples of the present disclosure. Although the method 120 is shown as involving operations in a particular order, it should be understood that some of the operations may be performed in a different order and certain operations described may be omitted from being explicitly shown in a block as part of FIG. 3 and instead described herein. Furthermore, the operations of the method 120 are described as performed by the memory controller 16. However, it should be understood that other suitable processing circuitry of an electronic device communicatively coupled to the memory device 12 may perform some or all of the operations represented via the method 120.

At block 122, the memory controller 16 may receive a command that instructs an access operation. That is, the memory controller 16 may receive a command or otherwise determine to access data stored in one or more memory cells 14 in association with a read operation, a write operation, or a refresh operation. The access operation may correspond to a destructive read operation and thus be paired with a write operation that causes the writing of new or repeated data. The memory controller 16 may receive the command from another portion of the memory system 8 and/or a corresponding host device.

At block 124, in response to the command, the memory controller 16 may precharge the digit line 26 to a Vread voltage level 96. Precharging the digit line 26 may make a subsequent read operation take less time to complete since the voltage of the digit line 26 may be already partially charged.

At block 126, in response to the command, the memory controller 16 may precharge the word line 18 to the initialization voltage (Vint) level 92. The memory controller 16 may do so at least in part by providing a first control signal 80 to the row driver 70 while precharging the digit line 26 at block 114. Providing the first control signal 80 may occur before or while the inverse WL select control signal 78B is transmitting via the row driver 70.

At block 128, during a next subsequent activation phase 98, the memory controller 16 may increase a voltage of the selected word line 18 to a voltage high (Vccp) level 100 from the initialization voltage (Vint) level 92. The memory controller 16 may do so at least in part by providing the second control signal 82 to the row driver 70 while continuing to transmit the inverse WL select control signal 78A. This gradually increases the value of the voltage transmitted to the selection component 52 on the word line 18.

After turning on the selection component 52, at block 130, the memory controller 16 may access the selected memory cell 14 via the selected word line 18 and the selected digit line 26. Performing the access operation may involve reading and/or writing data from the memory cells 14 activated. Sometimes, the access operation may involve performing a destructive read of data from the memory cells 14, followed by a write of the same data or different data to the memory cells 14 activated based on the generated boosted control signal or voltage. After accessing the memory cell 14 and obtaining an indication of contents of the memory cell 14 (e.g., data), the memory controller 16 may perform a processing operation based on the access operation and/or data received via the access operation. Indeed, the memory controller 16 may process data received from the access operation and/or may perform additional operations to prepare for subsequent memory access operations. The additional operations may be contingent on data received from the access operation and/or be based on successful completion of the access operation. For example, the additional operation may be that the memory controller 16 precharge one or more memory cells 14 before performing an additional memory access operation.

These systems and methods described herein may improve memory operations by precharging a word line of a FeRAM cell to an initialization voltage (Vint). Precharging methods were previously not feasible with DRAM cells due to charge storage memory approaches that generally do not tolerate a charge leak from a selected memory cell. FeRAM cells are more tolerate to charge leaks, such as when the charge leaked is less than a threshold voltage of a transistor of the memory cell. With this in mind, the initialization voltage (Vint) may be a value between an unselected, zero voltage (e.g., a voltage between −0.6 voltage (V) and 0V) and a high voltage (e.g., a voltage between 3.0V and 3.5V) used during the activation phase to turn on a transistor of the memory cell, such as a value between 0.1V and 1V. The initialization voltage (Vint) may be any suitable value that is high enough to improve a step in voltage between the unselected voltage and the high voltage but low enough as to mitigate eventual cell signal loss. Precharging the word line may reduce disturbances to nearby word lines normally caused during an access operation, as well as may reduce a time spent in an activation phase of the access operation. By doing so, cell read speeds may be increased, which may further benefit memory device operation by creating a timing buffer in memory operations (and thus reducing a likelihood that timing drift undesirably impacts data operations). These systems and methods may be applied to a variety of memory devices including both two-dimensional memories and/or three-dimensional memories (e.g., cross-point memories) to improve robustness of operations of the different memory devices.

With these technical effects in mind, multiple memory devices may be included on a memory module, thereby enabling the memory devices to be communicatively coupled to the processing circuitry as a unit. For example, a dual in-line memory module (DIMM) may include a printed circuit board (PCB) and multiple memory devices. Memory modules respond to commands from a memory controller communicatively coupled to a client device or a host device via a communication network. Or in some cases, a memory controller may be used on the host-side of a memory-host interface; for example, a processor, microcontroller, field programmable gate array (FPGA), application-specific integrated circuit (ASIC), or the like may each include a memory controller.

This communication network may enable data communication there between and, thus, the client device to utilize hardware resources accessible through the memory controller. Based at least in part on user input to the client device, processing circuitry of the memory controller may perform one or more operations to facilitate the retrieval or transmission of data between the client device and the memory devices. Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory, memory controller operations, and memory writing operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 20(f). However, for any claims containing elements designated in any other manner, it is intended that such elements are not to be interpreted under 35 U.S.C. 20(f).

What is claimed is:

1. A system, comprising:
a memory cell configured to be accessed based on a signal from a word line;
row driver circuitry configured to transmit the signal on the word line; and
a memory controller communicatively coupled to the memory cell and to the row driver circuitry, wherein the memory controller is configured to:
at a first time, wherein the first time corresponds to a start time of a digit line precharge operation, send a first control signal to the row driver circuitry, causing the signal to increase in voltage to a second voltage level from a first voltage level; and
at a second time, wherein the second time corresponds to a start time of an activation operation, send a second control signal to the row driver circuitry, causing the signal to increase in voltage to a third voltage level from the second voltage level.

2. The system of claim 1, wherein the memory cell comprises a ferroelectric random access memory (FeRAM) cell.

3. The system of claim 2, wherein the FeRAM cell lies between a plate line and a digit line, and wherein the FeRAM cell comprises a transistor coupled to the word line via a gate terminal.

4. The system of claim 1, wherein the memory controller is configured to:
receive a memory access command; and
in response to receiving the memory access command, perform the precharge operation at the first time and the activation operation at the second time.

5. The system of claim 1, wherein the row driver circuitry comprises a row driver that inverts a word line selection control signal based on a high voltage input and a low voltage input.

6. The system of claim 5, wherein the row driver circuitry comprises a switch coupled to the high voltage input, and wherein the row driver receives a voltage signal via the high voltage input transmitted via the switch.

7. The system of claim 6, wherein the switch is configured to couple to a first supply rail in response to the first control signal, and wherein the switch is configured to couple to a second supply rail in response to the second control signal.

8. A memory device comprising:
voltage shaping circuitry; and
a memory controller configured to cause the voltage shaping circuitry to adjust a characteristic of a word line select control signal at a first time, wherein the first time corresponds to a start time of a digit line precharge operation, and at a second time, wherein the second time corresponds to a start time of an activation operation, prior to being transmitted to a memory cell.

9. The memory device of claim 8, wherein voltage shaping circuitry comprises a row driver and a switch.

10. The memory device of claim 9, wherein the switch is configured to:
couple to a first voltage supply in response to the memory controller transmitting a first control signal to the voltage shaping circuitry; and
couple to a second voltage supply greater than the first voltage supply in response to the memory controller transmitting a second control signal to the voltage shaping circuitry.

11. The memory device of claim 10, wherein the row driver is configured to:
receive the word line select control signal from the memory controller; and
adjust an amplitude of the word line select control signal based on the first voltage supply or the second voltage supply after the switch has received the first control signal or the second control signal.

12. The memory device of claim 9, wherein the memory controller is configured to adjust the characteristic of the word line select control signal over different phases of an access operation.

13. A method, comprising:
charging a word line to a first voltage level at a first time, wherein the first time corresponds to a start time of a digit line precharge operation;
after the word line is at the first voltage level, charging the word line to a second voltage level greater than the first voltage level at a second time, wherein the second time corresponds to a start time of an activation operation; and
reading a value stored in a memory cell coupled to the word line in response to the word line being charged to the second voltage level.

14. The method of claim 13, comprising:
receiving a memory access command;
determining to perform an access operation on the memory cell based on the memory access command; and
in response to determining to perform the access operation, precharging the word line based on sending a word line select control signal via the word line.

15. The method of claim 14, comprising shaping the word line select control signal based on the first voltage level and the second voltage level.

16. The method of claim 14, comprising precharging a digit line while precharging the word line.

17. The method of claim 13, comprising performing an operation based on read data from the memory cell.

18. The method of claim 13, comprising:
sending a first control signal to a switch, wherein the switch is configured to couple a row driver to a first voltage rail characterized by the first voltage level in response to the first control signal, and wherein the row driver is coupled to the word line; and
sending a second control signal to the switch configured to couple the row driver to a second voltage rail characterized by the second voltage level in response to the second control signal.

* * * * *